(12) United States Patent
Luff et al.

(10) Patent No.: US 8,296,612 B2
(45) Date of Patent: Oct. 23, 2012

(54) POLYMORPHIC AUTOMATIC TEST SYSTEMS AND METHODS

(75) Inventors: Edwin F. Luff, Sherborn, MA (US);
Michael Platsidakis, Mansfield, MA (US)

(73) Assignee: Practical Engineering Inc., Framingham, MA (US)

( * ) Notice: Subject to any disclaimer, the term of this patent is extended or adjusted under 35 U.S.C. 154(b) by 0 days.

(21) Appl. No.: 12/660,593

(22) Filed: Mar. 1, 2010

(65) Prior Publication Data
US 2010/0318314 A1 Dec. 16, 2010

Related U.S. Application Data

(62) Division of application No. 10/995,083, filed on Nov. 21, 2004, now Pat. No. 7,673,197.

(60) Provisional application No. 60/524,231, filed on Nov. 20, 2003.

(51) Int. Cl.
*G01R 31/28* (2006.01)
*G01R 31/00* (2006.01)
*G06F 9/46* (2006.01)
*G06F 9/45* (2006.01)
*G06F 9/44* (2006.01)

(52) U.S. Cl. ........ 714/724; 324/73.1; 718/104; 717/153; 717/165; 702/117; 702/118; 702/119; 702/121

(58) Field of Classification Search .................. 714/724; 324/73.1; 718/104; 717/153, 165; 702/117–119, 702/121
See application file for complete search history.

(56) References Cited

U.S. PATENT DOCUMENTS

| | | | |
|---|---|---|---|
| 4,736,374 A | | 4/1988 | Kump et al. |
| 4,760,330 A | * | 7/1988 | Lias, Jr. ........................ 714/32 |
| 5,025,205 A | * | 6/1991 | Mydill et al. .............. 324/73.1 |
| 5,063,383 A | | 11/1991 | Bobba |
| 5,079,707 A | | 1/1992 | Bird et al. |
| 5,481,550 A | * | 1/1996 | Garcia et al. ................ 714/744 |
| 5,504,917 A | | 4/1996 | Austin |
| 5,629,632 A | | 5/1997 | Tsutsumi |
| 5,805,571 A | | 9/1998 | Zwan et al. |

(Continued)

FOREIGN PATENT DOCUMENTS
DE 10120080 11/2001

(Continued)

OTHER PUBLICATIONS

Supplementary European Search Report issued by the EPO in European Application 11007636.1-1231/2410345 on Mar. 28, 2012. (12 pages).

(Continued)

*Primary Examiner* — John J Tabone, Jr.
(74) *Attorney, Agent, or Firm* — Ivan David Zitkowsky

(57) ABSTRACT

An Analog/mixed signal automatic test system includes a software architecture that creates a virtual composite instruments through novel software dynamic allocation of low level resources. These virtual composite instruments provide backwards and forwards compatibility to a variety of automatic test equipment, known or available on the market. The virtual composite instruments are free from the normal constraints imposed by hardware implementations. Creation of the virtual composite instruments allows a single piece of automatic test equipment system to emulate many implementations of automatic test equipment, providing higher utilization, and therefore a lower cost test solution for device manufacturers. The test instruments are preferably object controls and are preferably instantiated and controlled by the test system server. This allows multiple users to control the tester simultaneously across, for example, the Internet.

30 Claims, 7 Drawing Sheets

U.S. PATENT DOCUMENTS

| | | | |
|---|---|---|---|
| 5,821,440 A | 10/1998 | Khater et al. | |
| 5,821,934 A | 10/1998 | Kodosky et al. | |
| 5,923,567 A | 7/1999 | Simunic et al. | |
| 5,926,774 A | 7/1999 | Ohishi | |
| 5,963,726 A * | 10/1999 | Rust et al. | 703/13 |
| 5,991,270 A | 11/1999 | Zwan et al. | |
| 6,031,387 A | 2/2000 | Berar | |
| 6,040,700 A | 3/2000 | Berar | |
| 6,061,283 A | 5/2000 | Takahashi et al. | |
| 6,085,156 A | 7/2000 | Rust et al. | |
| 6,104,721 A | 8/2000 | Hsu | |
| 6,128,759 A | 10/2000 | Hansen | |
| 6,192,496 B1 | 2/2001 | Lawrence et al. | |
| 6,223,134 B1 | 4/2001 | Rust et al. | |
| 6,243,833 B1 * | 6/2001 | Hitchcock et al. | 714/33 |
| 6,347,287 B1 | 2/2002 | Beckett et al. | |
| 6,401,220 B1 | 6/2002 | Grey et al. | |
| 6,404,218 B1 | 6/2002 | Le et al. | |
| 6,405,145 B1 | 6/2002 | Rust et al. | |
| 6,418,392 B1 | 7/2002 | Rust et al. | |
| 6,421,822 B1 | 7/2002 | Pavela | |
| 6,442,441 B1 | 8/2002 | Walacavage et al. | |
| 6,449,744 B1 | 9/2002 | Hansen | |
| 6,473,707 B1 | 10/2002 | Grey | |
| 6,546,359 B1 | 4/2003 | Week | |
| 6,557,128 B1 | 4/2003 | Turnquist | |
| 6,560,554 B1 | 5/2003 | Anderson | |
| 6,577,981 B1 | 6/2003 | Grey et al. | |
| 6,618,853 B1 | 9/2003 | Ohyama et al. | |
| 6,636,585 B2 * | 10/2003 | Salzberg et al. | 379/22 |
| 6,678,355 B2 * | 1/2004 | Eringis et al. | 379/22 |
| 7,107,173 B2 | 9/2006 | Fritzsche | |
| 7,117,411 B2 * | 10/2006 | McNeely et al. | 714/724 |
| 2002/0080811 A1 | 6/2002 | Wetzel et al. | |
| 2002/0183426 A1 | 12/2002 | Lamb, III et al. | |
| 2003/0004669 A1 | 1/2003 | Gorman | |
| 2003/0004670 A1 | 1/2003 | Schmit et al. | |
| 2003/0005155 A1 | 1/2003 | Carbonell et al. | |
| 2003/0005179 A1 | 1/2003 | Schmit et al. | |
| 2003/0005180 A1 | 1/2003 | Schmit et al. | |
| 2003/0058280 A1 | 3/2003 | Molinari et al. | |
| 2003/0135343 A1 | 7/2003 | Samuelson et al. | |
| 2003/0177426 A1 | 9/2003 | Bauwens et al. | |
| 2004/0066207 A1 | 4/2004 | Bottoms et al. | |

FOREIGN PATENT DOCUMENTS

| | | |
|---|---|---|
| JP | 03-123877 | 5/1991 |
| JP | 05-107310 | 4/1993 |
| JP | 10-063511 | 3/1998 |
| JP | 2002-15025 | 1/2002 |
| TW | 381183 B | 2/2000 |
| WO | WO 98/57187 | 6/1998 |
| WO | WO 99/53330 | 10/1999 |

OTHER PUBLICATIONS

International Search Report and Written Opinion issued in PCT Application PCT/US 04/39350 on Sep. 10, 1008 (9 pages).

Supplementary European Search Report issued by the EPO in European Application 04811971.3-1231/1695362 on Apr. 20, 2009. (5 pages).

* cited by examiner

POLYMORPHIC AUTOMATIC TEST SYSTEMS AND METHODS

This application is a divisional of U.S. application Ser. No. 10/995,083, filed 11/21/2004, now U.S. Pat. No. 7,673,197, which claims priority from U.S. Prov. Application 60/524,231, filed on Nov. 20, 2003, both of which are incorporated by reference.

The invention relates generally to automatic test equipment, and more particularly to analog/mixed signal automatic test systems.

BACKGROUND OF THE INVENTION

Automatic test equipment provides the ability for semiconductor device manufacturers to test semiconductor devices. By testing every device, the manufacturer can reject or accept the device and separate those rejected prior to them entering commerce.

Testing a semiconductor device typically involves the application of known signals to specific pins while measuring the output reaction of the device to those input signals. The output signals are then compared to the expected reactions and to determine whether the device under test (DUT) matches specified parametric limits.

Analog/mixed signal automatic test equipment architectures have traditionally been designed with sets of instrumentation organized by function with higher cost instruments provided as shared resources and lower cost functions provided as pin by pin resources. For example, low accuracy DC sources and meters provide a quick and inexpensive shorts/open test at every pin while a shared high accuracy DC source and meter might provide the accuracies necessary for parametric evaluation. All Analog/mixed signal automatic test equipment architectures contain a computer with test software to execute the tests automatically in sequence.

Analog/mixed signal automatic test equipment software architecture traditionally follows the linear flow programming models, where a single test program runs a single device under test in a very specific sequence. The program ends when the tests are gathered and evaluated against pre-programmed test limits and a pass/fail determination is made.

A variation on the linear flow programming model has been in use under the name of multi-site testing in which a single test program running multiple identical DUTs synchronously is performed.

In both types of analog/mixed signal automatic test equipment software architecture, the job program testing the device under test is given full control of all of the resources within the tester. This means that all resources not needed to test the particular device under test remain idle for the duration of the test program. Importantly, traditional analog/mixed signal automatic test equipment software architectures do not allow the use of the unused resources for any other tasks during testing.

Traditional automatic test equipment software architectures may use unique and proprietary languages and/or language structures. They also generally contain unique and proprietary bus structures. Users write job programs for this automatic test equipment and commonly the cost of writing these job programs exceeds the capital cost of the automatic test equipment. In order to change to another brand of automatic test equipment or to a newer version of the current system, it is frequently necessary to port these programs to a new proprietary language at great expense.

Typical automatic test systems have a single executable job program running within a computer's operating system. This means that the control of the program is generally local to the computer that is running the tester. They do not allow for the running of the tester remotely. Since many of these testers operate within clean room environments, it is necessary to go to the tester for debugging or setup of the program. Large losses of productivity can sometimes be traced to the suiting up process prior to entering a clean room environment.

Typical automatic test system architectures have a single job program written and run in the regional language (English, Japanese, French, etc.) of the test system developer. This means that the user of the tester may have to understand the language of the tester manufacturer in order to adequately communicate tester performance during maintenance assistance from the tester manufacturer. Since tester performance is frequently an interpretation of test results from specialized job programs, communication can be difficult across language barriers.

There are several prior art test systems such as the Teradyne A360 analog test system. The A360 system is an automatic test equipment (ATE) that has a physical instrument called "M601." The M601 instrument contains seven V/I sources, one voltmeter and a 9 line×48 pin cross-point matrix. The cross-point matrix connects any one of the V/I sources or the voltmeter to any one of the 48 DUT points (as described in "A360 Test Engineer's Manual" published by and available from Teradyne Inc., 321 Harrison Ave, Boston, Mass., 1984). For example, in the A360 tester job program, a user can connect 10 volts to DUT pin 1, and 0 volts to DUT pin 2, and the Voltmeter to DUT pin 3. In such a case, the A360 test program sets one of the M601 test instrument's seven V/I sources (e.g., S1) to 10v, connects this V/I source to one of the cross-point matrix lines (e.g., Line 1) and then closes the cross-point relay between line 1 and DUT pin 1. Similarly, the A360 test program sets S2 to 0 volts and connects it to, e.g., Line 2 and closes the cross-point relay between line 2 and DUT pin 2. The A360 test program can also connect the voltmeter to Line 9 and close the cross-point relay between Line 9 and DUT pin 3. There are several disadvantages with this architecture that allocates resources to the test job programs at the initialization time and releases them only at the end of the program.

The A360 also has a physical instrument called "M625." The M625 instrument is an AC source and measurement instrument consisting of two AC waveform generators for sourcing and a set of notch filters for input, and an AC to DC converter. The output of the AC-to-DC converter can be connected to a system DC voltmeter for measurement of AC waveforms. The instrument can also be directly connected to the DUT (as described in "A360 Test Engineer's Manual). In a tester job program, for example, the instrument generates a 100 Hz sine wave as a source to the DUT, and then it measures the harmonic noise component of the DUT's output. In this example, the DUT's output is primarily 100 Hz with a noise component. The instrument measures the output using a notch filter at the primary frequency to eliminate the 100 Hz primary frequency component so that just the harmonic noise is detected. The noise passes through a bandpass filter that is set to the harmonic frequency of interest. The AC to DC converter then delivers to the DC voltmeter a DC voltage proportional to the amount of harmonic noise at the output. This process is repeated over and over again with different bandpass filter frequencies to measure the different harmonic frequency contents. This architecture is again relatively inefficient.

The A360 also has a physical instrument called "M602." The M602 instrument is a single instrument has two high stability limited range voltage sources and one high precision voltmeter. This instrument can be directly connected to a DUT. A tester job program, for example, may need to provide a highly stable voltage of 10.0000 volts to a DUT to measure the DUT's output with very high precision. The instrument sets one of its two high stability sources to 10.0000 V and connects the M602 meter to the DUT's output for measurement. However, this architecture is relatively inflexible since it cannot flexibly replace the connected meter with a meter having a higher accuracy (such as the precision calibration meter of the instrument primarily used for test calibration).

Furthermore, there are several prior art test systems called "virtual test instruments" or "virtual front panels" of test instruments. These test instruments use a windowing software package (for example, Microsoft Windows® or Measurement Studio® by National Instruments) to provide the equivalent of an instrument front panel in a software form. In these virtual instruments, buttons and windows and indicators replicate or mimic the front panel of a benchtop standalone instrument (e.g., a digital multi-meter, DMM, or a current source). The "virtual front panel" of these instruments replaces all or part of the buttons, knobs, and indicators that would normally be on a front panel of a higher-level instrument.

Furthermore, there are virtual instruments (e.g., provided by National Instruments Inc.) that provide a common front panel for multiple different vendor implementations of a common instrument. For example, all DMMs share common attributes such as voltage range setting, a voltage metering indicator, etc. This single common "virtual front panel instrument" is suitable for operating instruments by different vendors or different models. The term "Virtual instrument" also describes the use of a common language API (application programming interface) specification for multiple similar instruments, as embodied in the Virtual Instrument Software Architecture (VISA) standard (IEEE 488.1 and IEEE 488.2).

There is still a need for an automatic test system that solves at least some of the above problems or drawbacks.

SUMMARY OF THE INVENTION

The present invention is an analog/mixed signal automatic test system, method and computer program product having a novel architecture for testing analog and mixed signal semiconductor devices. Advantageously, the automatic test system can create virtual composite instruments that mimic (or emulate) existing instruments and are dynamically allocated to running multiple DUTs with multiple job programs simultaneously.

According to one aspect, the automatic test system includes a novel software architecture that provides concurrent running of multiple unique DUTs.

According to another aspect, the automatic test system includes a novel software architecture that provides dynamic resource allocation of all tester source, meter and control resources.

According to yet another aspect, the automatic test system includes a novel software architecture that provides virtualization of loosely connected tester resources into recognizable instruments.

According to yet another aspect, the automatic test system includes a novel software architecture that provides server capabilities of all test resources (that is, exposes all tester resources within a common server).

According to yet another aspect, the automatic test system includes a novel software architecture that provides server capabilities of all test resources and graphical user interfaces to allow control and running of the tester in multiple languages remotely and simultaneously.

According to yet another aspect, the automatic test system includes a novel software architecture that provides the capability to mimic the structure of other automatic test equipment, including various prior art testers (i.e., emulate the functionality and hardware architecture of the prior art testers such as the testers described above).

According to yet another aspect, an automatic test system includes a hardware layer including at least two resources, a server executable including at least two resource instrument components corresponding to the at least two hardware resources, and a dynamic resource allocation component.

Preferred embodiments of this aspect include one or more of the following features: The automatic test system further includes at least two virtual composite instrument components. The dynamic resource allocation component maintains a list of all available resources and their current state. The dynamic resource allocation component maintains a list of known instruments. The dynamic resource allocation component maintains list of virtual to physical connection possibilities. The dynamic resource allocation component builds a map of virtual to physical resource addresses. The dynamic resource allocation component performs the work of reserving and releasing resource instrument components. The dynamic resource allocation component, after dynamically reserving resource components, returns the components to an available resource pool when no longer needed.

The automatic test system is adapted to operate as a server. The automatic test system is adapted to interact with multiple clients concurrently or virtually concurrently. The automatic test system is adapted to run multiple job programs virtually concurrently and is adapted to run multiple debug environment components virtually concurrently.

According to yet another aspect, a composite instrument component for use in an automatic test instrument includes at least two resource instrument components associated with at least two test elements, and a composite instrument template for combining the two resource instrument components to form an interactive object.

Preferred embodiments of this aspect include one or more of the following features: At least one of the test elements is a hardware test element. At least one of the test elements includes a combined hardware-software test element. The combined hardware-software test element may include an analog-to-digital converter (ADC) and an analyzer using a Fast Fourier Transform (FFT) technique.

The interactive object includes definitions provided in a Teradyne test system. Then, the resource instrument components of the instrument are controlled by a Teradyne test system language. Alternatively, the interactive object includes definitions provided in an LTX test system. Then the resource instrument components are controlled by an LTX test system language. Alternatively, the interactive object includes definitions provided in a Credence test system. Then, the resource instrument components are controlled by a Credence test system language. Alternatively, the interactive object includes definitions provided in a specifically designed test system. Then, the resource instrument components are controlled by the language of the specifically designed test system.

The test elements may be hardware sub-components or hardware components. At least one of the hardware components is a high-level discrete instrument. This high-level discrete instrument may be a digital multimeter, a voltage source, a current source, a frequency generator, or other.

According to yet another aspect, a site component for use in an automatic test instrument includes a test program component including dynamic link library for loading into an address space of a server, and a programming environment component arranged to load the test program component into its address space and execute test program functions. The test program component and the programming environment component may be built as executables for running outside the server for remote operation of tester.

According to yet another aspect, a server executable for use in an automatic test instrument includes at least two resource instrument components, a composite instrument component, a dynamic resource allocation component, and a site component.

Preferably, the composite instrument component includes at least two resource instrument components being associated with at least two test elements and a composite instrument template for combining at least two the resource instrument components to form an interactive object. The dynamic resource allocation component may include a list of resource instrument components including their availability status, and a map of virtual composite physical resource addresses.

The polymorphic architecture allows the creation of one or more composite instrument components. A composite instrument is made from the combination of two or more hardware components or sub-components of multiple physical instruments for the purpose of creating a new "virtual instrument" that resembles prior art instruments and responds to any prior art control software.

The dynamic resource allocation process allocates and de-allocates one or more complete components or sub-components of physical instruments (i.e., hardware or software or their combination) to facilitate two or more running test job programs dynamically. This allocation process allows resources to be shared among the multiple test job programs running simultaneously but asynchronously. This dynamic resource allocation process has numerous advantages over prior art using static resource allocation, i.e., resources are allocated to the test job programs at initialization time and are released only at the end of the program.

The polymorphic automatic test system is a collection of hardware resource components and automated software for implementing measurement specific tasks. The test system combines several metering, source and control resources together in software to create a composite instrument. This composite instrument can use different existing languages, and does not need one common language.

The virtual composite instruments mimic existing instruments and are dynamically allocated to run multiple DUTs with multiple job programs simultaneously. The control of the virtual composite instruments is done by a tester server architecture that allows for full multi-user remote control in multiple regional languages. This provides higher test resource utilization, reductions in overall test time, reductions in tester size and reductions in maintenance costs.

The novel system can also set up and use one or several virtual composite instrument graphical user interfaces. The novel system can also set up and use one or several virtual composite instrument programming interfaces and/or connections.

The automatic test system, along with its method and related computer architecture, provides one or several of the following advantages: The novel system provides an analog/mixed signal automatic test equipment software architecture that allows multiple types of DUTs to be run simultaneously and asynchronously, thereby allowing tester resources to be released and used by other test programs. This architecture increases the utilization of tester resources and increases the productivity of our novel tester.

The novel system provides an analog/mixed signal automatic test equipment software architecture that allows the multitude of available job programming languages to be run without a long and costly re-development of the test programs. In order to change to another brand of automatic test equipment or to a newer version of the current system, it is no longer necessary to port these programs to a new proprietary language at great expense.

The novel system provides an analog/mixed signal automatic test equipment software architecture that allows the complete remote operation of the tester. This means that the control of the program is no longer local to the computer that is running the tester, but to the one running the tester remotely. Since many of these testers operate within clean room environments, it is no longer needed to go to the tester for debugging or setup of the program.

Thus, the novel system provides an analog/mixed signal automatic test equipment software architecture that allows the complete remote operation of the tester by multiple users simultaneously and can do so in multiple regional languages.

The described automatic test systems are built on the general state of the art and various current methodologies of Automated Test Equipment, for example, as described in "An Introduction to Mixed-Signal IC Test and Measurement," by Mark Burns and Gordon W. Roberts, (Oxford University Press, 2001), which is incorporated by reference in its entirety. Below, we provide an example of a snippet of test language source used in the novel dynamic resource allocation algorithm. The used snippet is based on Teradyne Pascal/Steps™ Reference Manual published in 1985. Other examples of test languages include those in the following references: Motorola DTS Software Manual (1995), Teradyne Image Base Language Manual (1996). All of these publications are incorporated by reference in their entireties.

The automatic test system builds on several prior art system architectures, for example, "Teradyne A360/A360Z/A370 Test Engineering Manual", and "Teradyne Advanced Mixed Signal Instrumentation Manual" (1996), wherein all of these publications are incorporated by reference in their entireties.

The automatic test system also builds on several prior art libraries and databases, such as, "Analog Functional Testing at the Board and Box Level," a Teradyne white paper, by Stephen Fairbanks, and "The Measurement Revolution," a National Instrument white paper (1999), wherein all of these publications are incorporated by reference in their entireties.

DETAILED DESCRIPTION OF AN ILLUSTRATIVE EMBODIMENT

Figure 1A:
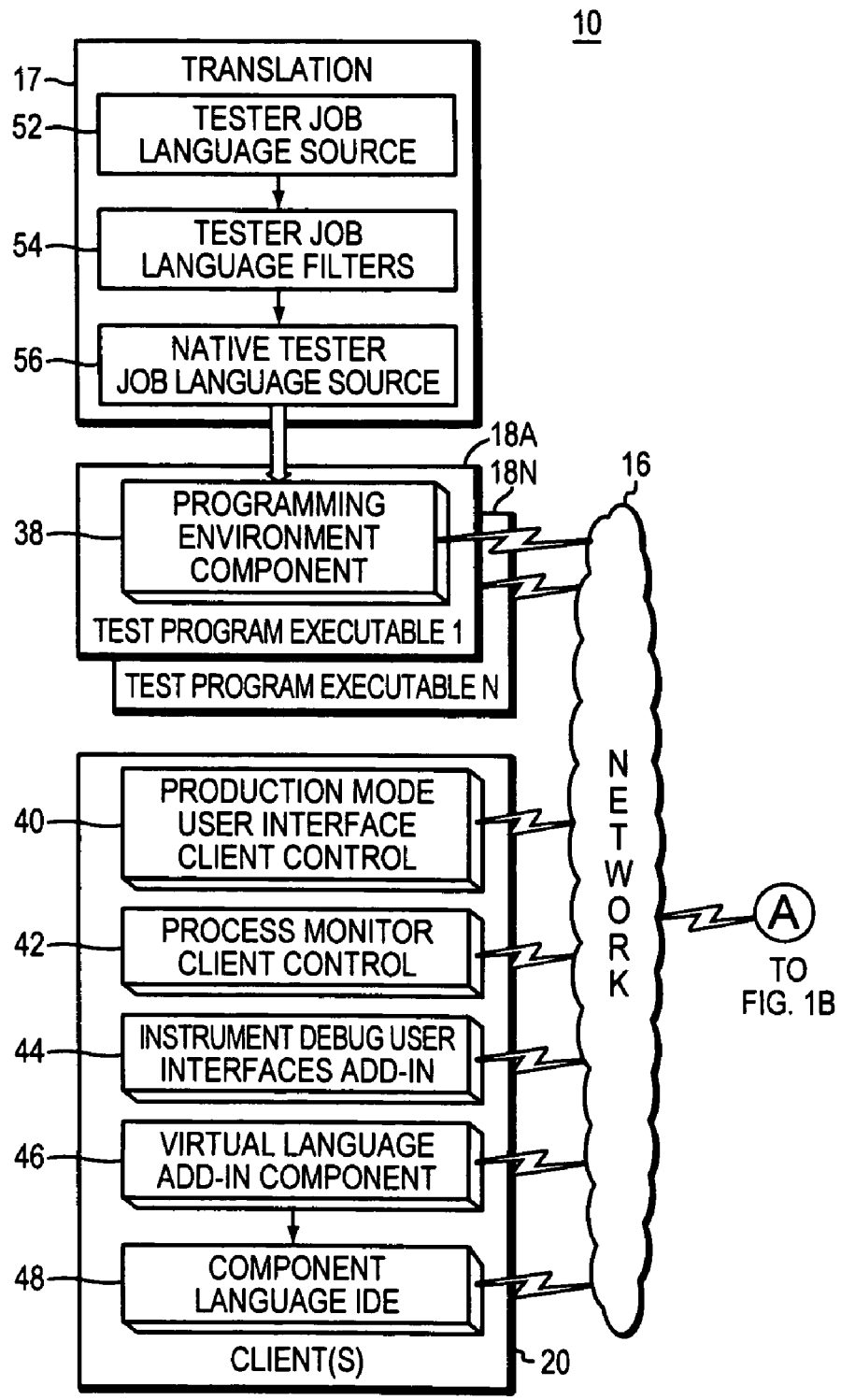
FIGS. 1A and 1B illustrate a polymorphic automatic test equipment system with external job executables.
Figure 1B:
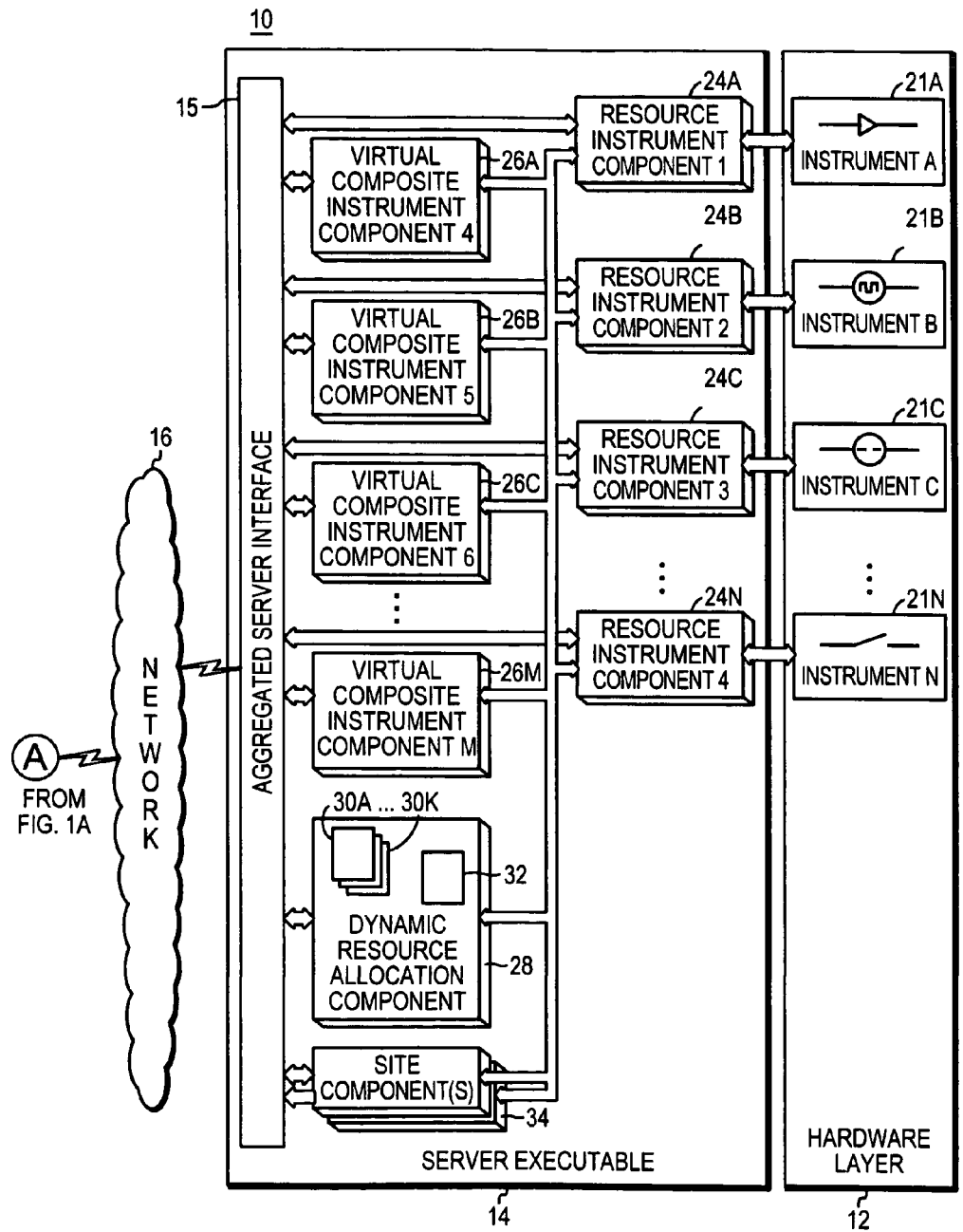

FIGS. 1A and 1B are high level block diagrams of a polymorphic automatic test equipment system 10, which illustrate a hardware layer 12 and a software architecture including server executable 14 (FIG. 1B) and external job executables 18A through 18N (FIG. 1A). Hardware layer 12 includes several hardware resources 21A, 21B . . . 21N, generally considered at a low level of capability. Polymorphic automatic test equipment system 10 uses any of the known and publicly available computer hardware systems.

For example, hardware layer 12 may include one or a group of each of the following hardware elements: A control bit, a voltmeter, an amp meter, a current source, a digital drive channel, a digital receive channel, a clock, a time measurement meter, an AC source, a digitizer, an RF source, an RF detector, an RF meter, relays, and/or optical elements including a laser diode, an LED, or other sources of electromagnetic radiation, and a photodiode, a photoresistor or other detectors. Furthermore, hardware layer 12 may include groups of dissimilar resources arranged as a superset instrument, such as an analog pin measurement unit, a probe control unit, a handler control unit, a serial port controller, a cross point matrix, and/or a relay multiplexer. The automatic test equipment system may also include software-constructed instruments without hardware such as a datalogger, a post process data analyzer, or an oscilloscope window.

Each hardware resource is tightly bound and controlled from within a corresponding resource instrument component (24A, 24B . . . 24N). The resource instrument component is a software driver written as a Microsoft COM component. Using component technology provides a robust, optimized methodology to control individual resources from multiple sources. Preferably, Microsoft COM or .NET technology is used, but the present system is not restricted to the use of these technology.

Server executable 14 includes resource instrument components 24A, 24B . . . 24N, virtual composite instrument components 26A, 26B . . . 26M, a dynamic resource allocation component 28, and one or multiple site components 34. A network 16 enables communication between test program executables 18A . . . 18N, clients 20 and server executable 14.

Each resource instrument component (24A, 24B . . . 24N) provides a well-defined interface of methods, properties and events that define completely the capability of the corresponding resource. Each virtual composite instrument component (26A, 26B . . . 26M) is an interactive object that defines a collection of resources that emulate prior art instruments. The low-level instrument interfaces are passed on to the high-level "virtual composite instrument." The "virtual composite instrument" then takes the collection of instrument interfaces and "builds" a new instrument using the appropriate functionality exposed by the low-level interfaces.

For example, a new "virtual composite" instrument may be created by the combination of APMU (Analog Pin Measurement Unit-V/I pin) and TMU (time measurement unit) functionality where the new "virtual composite" instrument may have 1 or 2 pins which have time measurement capability in addition to V/I capability. The "virtual composite" instrument enables this functionality using a new "APMU-TMU" instrument along with its companion user interface. The new "APMU-TMU" instrument is a virtual composite instrument that does not exist by itself, but only if the resources of an APMU and a TMU are available and accessible (as explained in connection with FIG. 3). Unlike some prior art instruments, this does not require writing code in a test program for two separate instruments (i.e., an APMU and a TMU), nor the usage of two separate debug user interfaces for debugging the test program code.

Figure 2A:
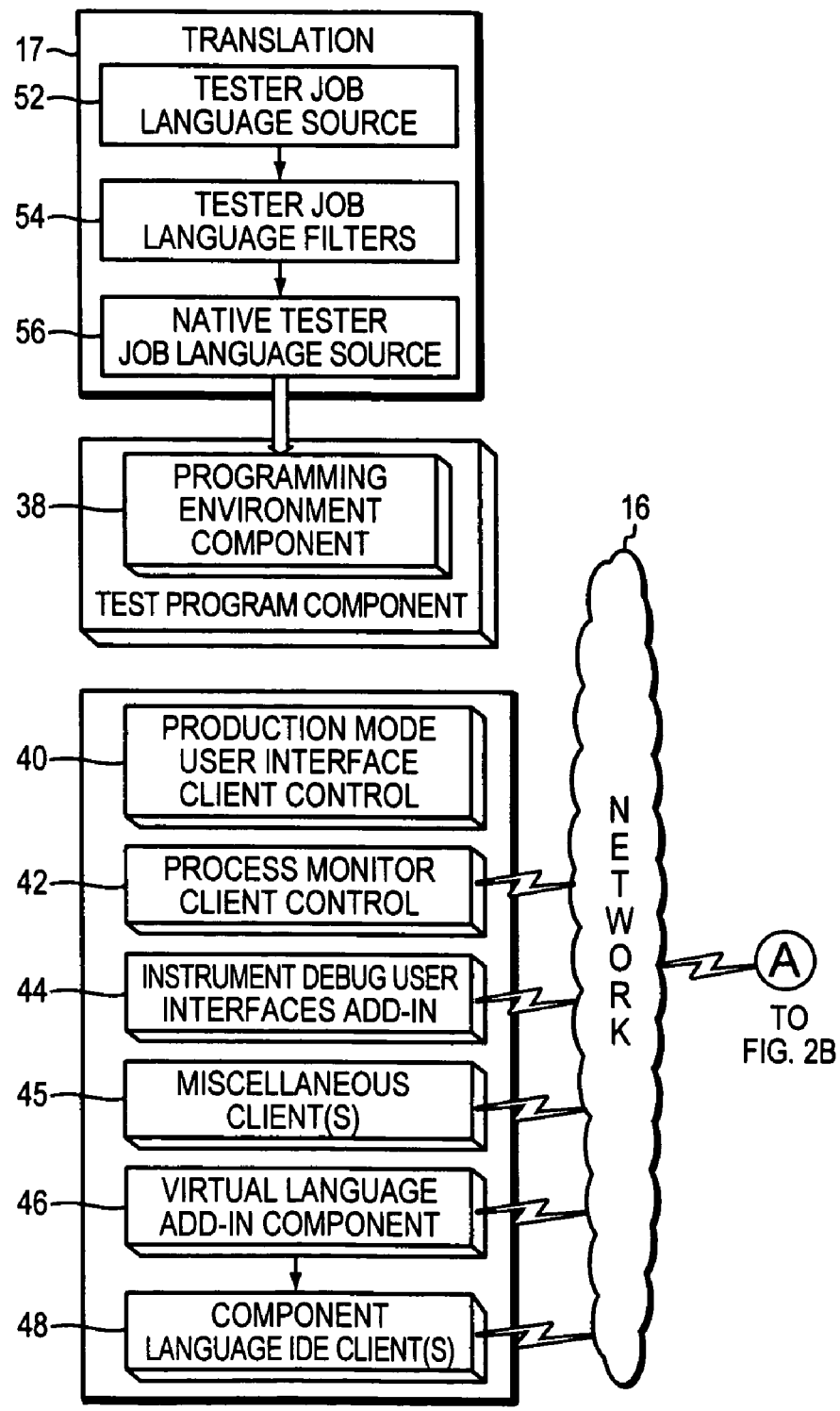
FIGS. 2A and 2B illustrate another embodiment of a polymorphic automatic test equipment system with internal job components.
Figure 2B:
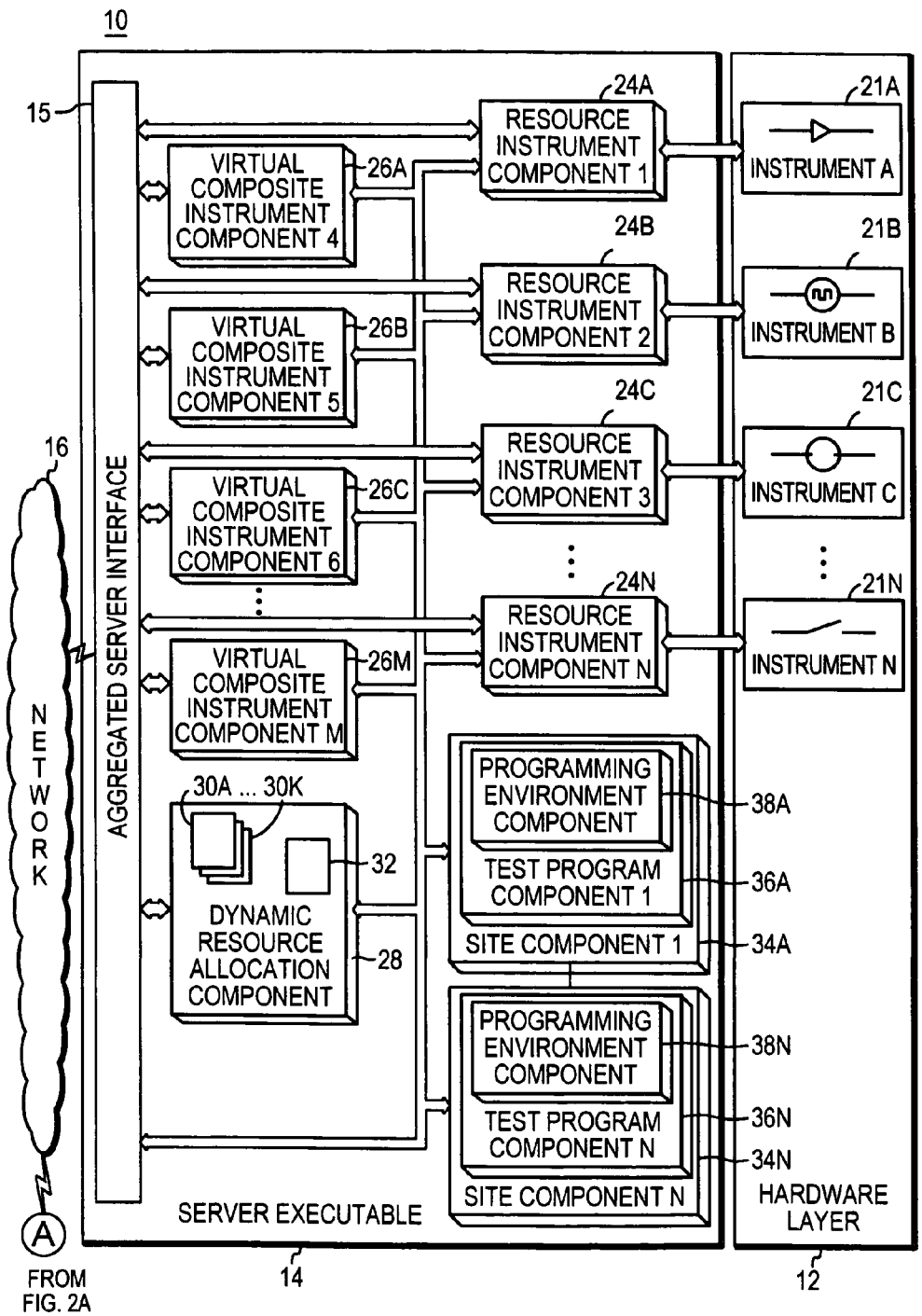

FIGS. 2A and 2B are high level block diagrams of another embodiment of the polymorphic automatic test equipment system 10 illustrating hardware layer 12 and software architecture with internal job components. Server executable 14 includes resource instrument components 24A, 24B . . . 24N, virtual composite instrument components 26A, 26B . . . 26M, dynamic resource allocation component 28, and site components 34A . . . 34N. Dynamic resource allocation component 28 includes lists of available resources and their states (i.e., lists 30A . . . 30K) and maps of virtual composite physical resource addresses 32. Each site component 34 includes a programming environment component 38 and a test program component 36.

Referring to FIG. 2B, each test program component 36 can be loaded and linked in run time into a site component 34. Test program component 36 is a Windows COM dynamic link library (dll) loaded into the server's address space. The programming environment component 38 loads the test program component (also a Windows COM dll into its address space and executes test program functions (i.e., tests, or other sequence-related functions) when it is accessed through its interface 15 via the production mode user interface, or other external debug user interfaces (i.e., an instrument user interface).

The test program component 36 and the programming environment component 38 can be built as executables and run outside the server for remote operation of the tester. The test program components 36A . . . N contain the information needed to sequence hardware resources 21A . . . 21N in a way that tests an analog/mixed signal semiconductor device under test (DUT).

Each site component 34 provides the structure from which to run test program component 36. Site component 34 requests resources from dynamic resource allocation component 28. Dynamic resource allocation component 28 responds to the requests from one or several site components 34 to assemble virtual composite instruments from available resources.

Dynamic resource allocation component 28 keeps a list of all available resources (30A . . . 30K) and their current state. Dynamic resource allocation component 28 also maintains a list of known instruments and a list of virtual to physical connection possibilities 32. These lists are built either manually (for fixed connections), interactively (through a user interface for user modified connections), or dynamically in cases where multiple virtual resources can connect to physical outputs such as in the case of a cross-point matrix or a relay multiplexer connection. Upon request, dynamic resource allocation component 28 builds a map 32 of virtual to physical resource addresses and maintains one or several maps 32. Furthermore, dynamic resource allocation component 28 performs the work of reserving and releasing resource components, as described in connection with FIG. 3.

Figure 3A:
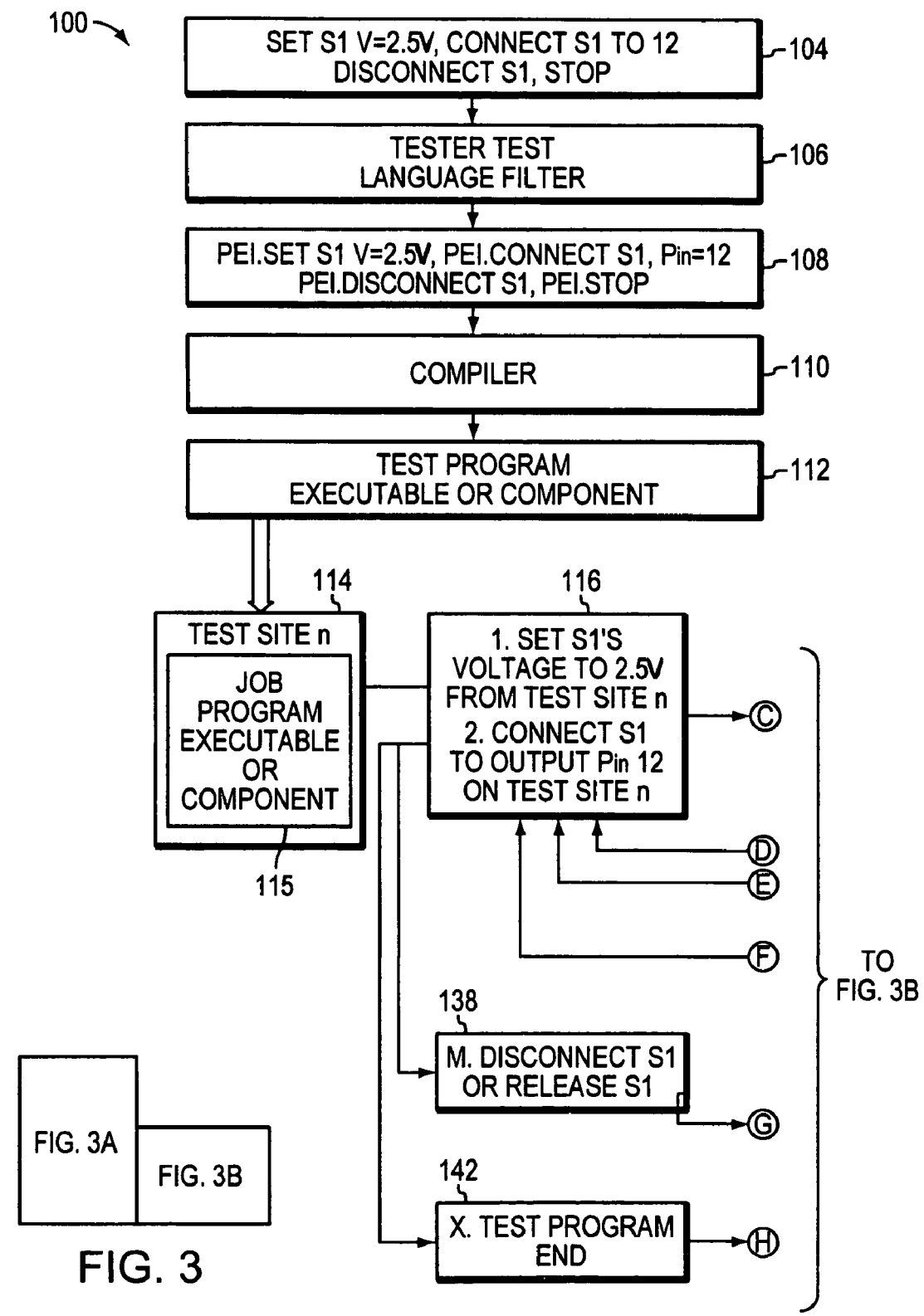
FIGS. 3A and 3B is a flow diagram illustrating dynamic resource allocation.

FIGS. 3A and B illustrate reserving and releasing various resource components of the automatic test system. FIG. 3A also illustrates the system's ability to use code written in prior art tester languages. Block 104 is a snippet from a test written, for example, using Teradyne's Pascal/Steps™ tester language used in their A3xx tester products. The test may include four statements for setting the output voltage source instrument called S1 to 2.5 V, then connecting it to DUT pin 12 through a cross-point matrix, then, disconnecting the voltage source, and stopping the test (as shown in block 104). This test algorithm is submitted to a test language filter (step 106).

The output of the test language filter after step 106 is a source program written in the native language of tester 10. As shown in block 108, this new code may differ slightly syntactically but executes essentially identical functions. The native language source test program is submitted to a compiler (step 110) to create either a test program executable or a test program component, step 112, (shown in FIGS. 1 and 2, 18) for running by the new tester. The difference between either is whether it is being run remotely (as an executable) or embedded (as a dynamic link library).

Regarding the second statement (block 108), the missing information for creating the test program is given (i.e. connect to output pin 12). Installation of the second statement will follow the same logic as the first statement for the dynamic resource allocation control 101. The third statement 'PEI.Disconnect S1 ' or any statement of the type 'PEI.Release S1 ' causes the dynamic resource allocation component 28 to reset the object's state within its reserved physical resource table 30. Referring to block 108, the fourth statement 'PEI.STOP' causes the dynamic resource allocation component to reset the state of all objects that were created for this site within its reserved physical resource table.

The test program executable or test program component is installed by a user into a specific test site (block 114). The user-controlled installation of the test program executable or test program component and execution is as follows: The test site 114 launches the running of the test program. Each program statement that includes an instrument statement causes a request from the dynamic resource allocation control (shown in block 101, FIG. 3B).

Referring to block 116, the test program sets 'PEI.SET. S1 V=2.5v', and the dynamic resource allocation control 101 looks into its reserved physical resource table (30 in FIGS. 1 and 2) to see if it has already allocated a physical voltage source resource to the site that is requesting it (step 118).

In step 118, if an S1 instrument already exists, it returns the interface to that S1 instrument (step 120). In step 118, if an S1 instrument does not exist, the dynamic resource allocation control tests if it has all of the information necessary to select or create such an instrument (step 122). In step 122, the system asks if a virtual composite instrument of type S1 has been defined in the pool of virtual composite instrument components. If this is not the case, the algorithm returns a response that indicates that more information is necessary (step 128). If it is determined at step 122 that an S1 instrument can be created, the algorithm checks the available pool of instantiated virtual composite instrument components for availability (step 124).

In step 124, if a virtual composite instrument component is available to emulate an S1 instrument, the allocation algorithm returns the interface to that emulated S1 instrument and places that state information within its reserved physical resource table (step 126). In step 124, if a virtual composite instrument component is not available to emulate an S1 instrument, the algorithm checks the virtual to physical connection data table to see if a connection can be made by instantiating a new object of the type S1 to the requested output pin (132).

In step 132, if there is a reserved physical resource, the algorithm checks, in step 130, if an identical resource has been released by another test program. In step 130, if there is no identical resource released by another test program, the algorithm enters a time-out loop 130 and 134. That is, the algorithm waits in the time-out to look for a specific time period until an identical resource is released by another test program. The loop testing continues until a suitable object of type S1 becomes available or a time-out occurs. After that period, the algorithm returns an error (step 136). If an identical resource is released by another test program, the algorithm acquires a reference to the S1 object (step 126), returns the interface to this S1 instrument (step 120), and places that state information within its reserved physical resource table.

In step 132, if there is no reserved physical resource, the algorithm checks if an existing reserved S1 object may become available if it is released at a future time. The error message in step 136 informs the caller of unavailable resources.

The reserved physical resource table 30 is built and maintained dynamically within the dynamic resource allocation component 28. The virtual to physical resource database 32 is built manually or semi-automatically outside of the dynamic resource allocation component and contains a table of known prior art instrumentation, the attributes of such instrumentation and the connection capability within the current test system. (i.e., a new tester voltage source #1 can be connected to output pins 1-12), this database can be stored in a file, a database or a system registry.

The pool of instantiated and un-instantiated virtual composite instruments is created at startup of the server from information contained within other 'virtual composite instrument components' combined with the information within the virtual to physical resource database. While these instantiations can be done dynamically, it is generally inefficient to do so.

Referring again to FIG. 1 or 2 A and B, as described above, dynamic resource allocation component 28 allocates resource instrument components (24A . . . 24N) dynamically and returns them to the available resource pool when done. This maximizes the hardware resource utilization and prevents allocation of the same resource to two or more requestors at the same time.

Server executable component 14 is interfaced to network 16 using an aggregated environment server interface 15. This allows a uniform single interface point for all resources and optimizes the coordination of client operation. This is done by combining the interfaces of the integral components into aggregated environment server interface 15, wherein resource instrument components 24, virtual composite instrument components 26, site components 34, and dynamic resource allocation component 28 are advantageously grouped within server executable component 14, as shown in FIG. 1B.

Server executable component 14 is a server component that allows a plurality of client connections concurrently. It is constructed as COM executable, multithreaded and implemented as a singleton. Since this component is built using component technology, communications are transparent and functional across a plurality of communication methods, including the Internet.

A plurality of production mode user interface client components 40 provide an interface into the running job programs and all running processes for the user: Multiple production mode user interface client components 40 can be looking at the same running processes. A plurality of process monitor client components 42 provide an interface for post processing and monitoring running processes.

The job program executables (18A . . . 18N) are created from a VB.NET tester job language source 56 program that is either created manually or derived from an existing tester job language source 52 by passing it through a tester job language filter 54, which converts known tester job language source 52 into syntactically similar VB.NET tester job language source 56 (as mentioned in connection with FIG. 3). The VB.NET tester job language source can be debugged from within a VB.NET programming environment. The VB.NET programming environment has been supplemented by a plurality of virtual composite instrument debug add-in components 44 and virtual composite instrument language add-in components 46.

The virtual composite instrument debug add-in components 44 are designed to add prior art instrument knowledge to the programming environment. They provide a real time interactive control of all virtual composite instruments from within the VB.NET environment. The virtual composite instrument language environment add-in components 46 add program methodology to the VB.NET environment. An example might be a known automatic program generator or a sequence table programmer.

The collection of tester job language filters 54, virtual composite instrument language environment add-in components 46, virtual composite instrument debug add-in components 44, virtual composite instrument components 26, and the dynamic resource allocation component 28 combine to form the ability to completely mimic (or emulate) prior art automatic test equipment including test language, test development environment, hardware instrument functionality and instrument debug capability.

Figure 4:
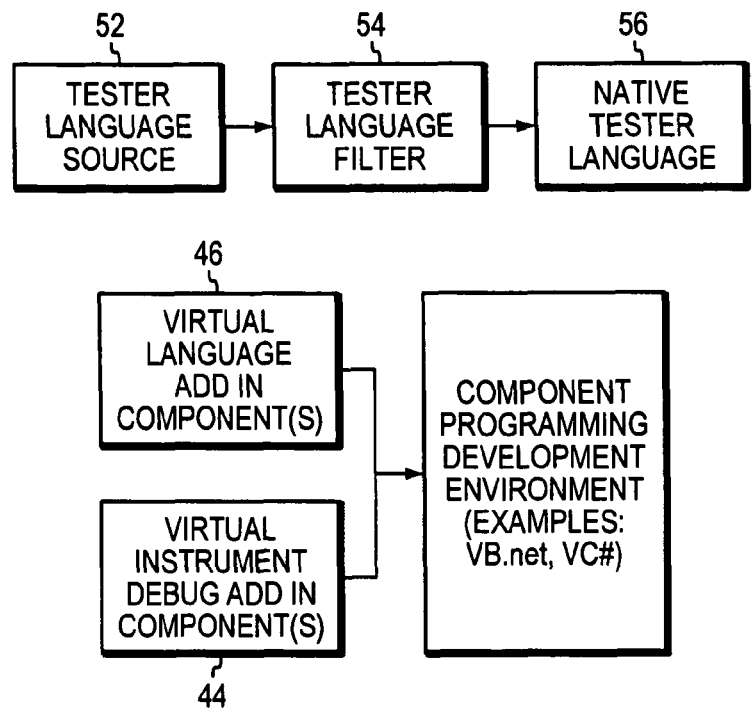
FIG. 4 is a block diagram for illustrating the ability to mimic technology components.
Figure 4:
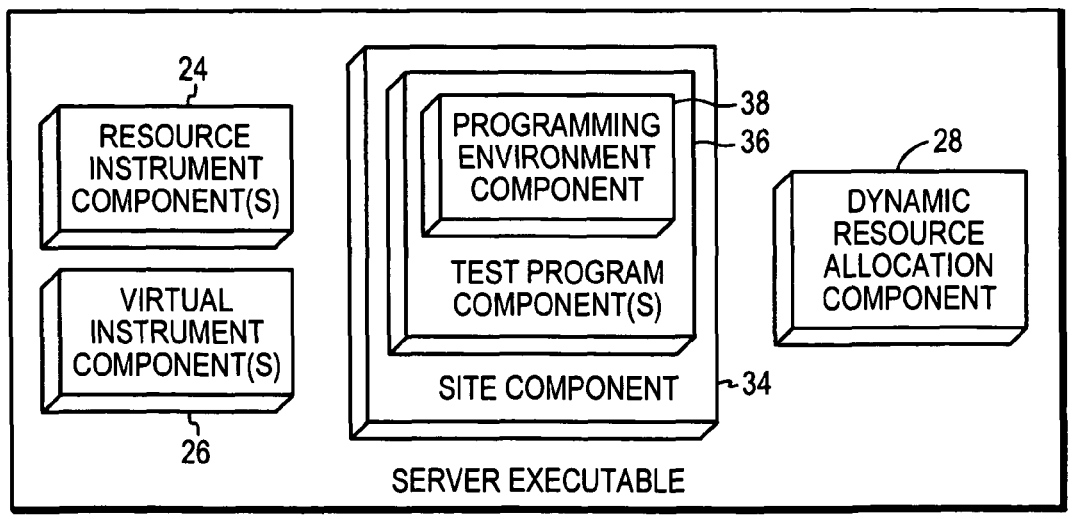

Referring to FIG. 4, in order to completely emulate prior art instruments, it is necessary that the prior art test programming language is understood and importable with minimal modification required by the test engineer. It is also required that the programming development environment with which he programs and debugs the new test program provides the tools and features that were available within the prior art test programmer's development environment. Also, the instrumentation of the prior art tester must be available in order to do the physical testing of DUT. These elements are the necessary ones to completely satisfy this need.

A. Tester Job Language Filters (54)

Prior art testers are generally programmed in simple but well described test languages that are variants of different known languages such as Basic, C or Pascal. The test language generally supports a subset of the language structures of the known language and libraries of instrument related subroutines, functions or procedures. They generally maintain the syntax of the known language but add some syntactical references to that language such as the use of units combined with numbers (i.e., 4V means a voltage of amplitude 4.0000 volts).

It is necessary to filter these programs into a source code understandable by the new tester. The tester job language filter is a program that converts the existing prior art test program into a new language supported for component development such as VB, VB.NET, VC, VC$_{++}$, VC#.NET, and Java to name a few. The output of the filter must be syntactically correct and must maintain the flow and structure of the prior art test program.

B. Virtual Composite Instrument Language Environment Add-In Components (46)

With many prior art testers, a development environment was provided that included capabilities not found in the programming development environments of new languages. Many of the new language program development environments are extensible to the point that it is possible to provide components to add capabilities that emulate the prior art development environment. For example, in the Teradyne Pascal/Steps™ development environment, there was the notion of a table resembling a device test specification list known as a Sequencer. The Sequencer looked like a table of information that provided information on the test procedure name, its limits and the disposition of the part if it violated the test limits. In one preferred embodiment of the invention, the use of a virtual composite instrument language environment add-in component is added to the VB.Net programming development environment to add the capability to show a procedure in a table similar to the prior art Sequencer table rather than in sequentially programmed lines of code.

Another example might be the use of visual icons to represent test functions that can be built graphically and can be implemented through a virtual composite instrument language environment add-in component. Yet another example might be an automatic program generator that could output language statements based on a database input.

C. Virtual Composite Instrument Debug Add-In Components (44)

Many prior art run time environments contain methods for interacting with the instruments to extract status or results or to change the state of the instrument dynamically.

It is necessary to create a component that allows the interactivity with the user on a demand basis. Virtual composite instrument debug add-in components can attach to the interface of existing virtual composite instruments and provide the ability to monitor status or results and to force changes to the state of the emulated virtual composite instrument.

D. Virtual Composite Instrument Components (26)

Each prior art instrument must be defined within the boundaries of the new hardware resources available. The virtual composite instrument component contains all of the functions, data, and capability of the emulated instrument as well as the information necessary to determine what collection of new hardware resources are necessary to provide that instrument capability.

Any hardware resource or collection of hardware resources that has more capability than the prior art instrument can be used. It is important to note that the limits of the prior art instrument must be maintained or a risk of damage to the device under test may occur.

For example, in the Teradyne S1 source, the voltage is limited to 60 V and the current is limited to 200 mA. If a new hardware resource can exceed those limits, the virtual composite instrument component must and will constrain the outputs to safe values.

E. Dynamic Resource Allocation Component (28)

The operation of Dynamic Resource Allocation Component 28 is described above in detail in algorithm 101 shown in FIG. 3B, and in the process provided below. By building the working software of the tester as a server, multiple clients, multiple job programs and multiple debug environment components can run concurrently. The aspect of the invention allows multiple programs written in different computer languages to be run, monitored and debugged concurrently.

By building the working software of the tester as a server using component software technologies, multiple clients, running the tests in a plurality of locations and regional languages can connect, control and view the status of a single or a plurality of running programs across any TCP/IP communication path including the Internet.

By building the working software of the tester as a server using component software technologies, multiple job programs, running in a plurality of locations and regional languages can connect, control and view the status of a single or a plurality of running programs across any TCP/IP communication path including the Internet. These programs need not be a common device under test, but can be a variety of devices under test.

The polymorphic automatic test system 10 uses a graphical user interface that includes graphical objects and commands. The graphical objects are represented on the screen and the commands create, edit and/or delete the objects.

Different graphical objects embody different concepts. For example, an on/off switch of a instrument can be represented by a button, the button has two states—ON and OFF. These states can be represented graphically by changing the image contained within the button to show depression of the button when on. When the user directs a mouse pointer to the button and presses the mouse button, the graphical button changes it's image to reflect the changed state. The states may alternatively be shown through text or color or both, where the color of the button changes from red to green to denote state or the text changes from ON to OFF to denote state. A prior art voltmeter may have included an indicator made up of a printed scale and a needle pointer that moved to indicate voltage. A graphical representation might include a window containing a picture of the printed scale and an overlay picture of a needle pointer that is redrawn to indicate voltage. Alternatively, it could be represented by an image of an LED indicator showing the voltage value. That is, the image is reified into a tool. This reification creates new objects that can be manipulated by the user.

The test system 10 also uses an interaction instrument that is a mediator between the user and objects of interest, wherein the user modifies an image, which in turn acts on the objects.

The test system 10 is a polymorphic test system that enables a single command to act onto several objects of different types. Thus, the system's polymorphism not only allows the use of a small number of commands applicable to different drivers, but also the use of prior art commands that were designed to control prior art instruments, even as reification increases the number of object types. This property allows the system to utilize several different languages.

Applying a command to a group of objects involves polymorphism at several levels. First, most commands that apply to an object can also be applied to a group of objects of the same type by applying them to each object in the group. Second, such commands can also be applied to a heterogeneous group of objects, i.e. objects written in different languages, as long as they have meaning for each of the individual object types.

The architecture of the test system enables also reuse that involves previous input, previous output or both. The input reuse makes a previous user input available for reuse in the current creation of composite instruments. The system's polymorphism facilitates input reuse because a sequence of actions can be applied in a wider range of composite instrument components.

According to one illustrative example, the Teradyne A360 analog test system includes the M601 instrument using a crosspoint matrix, as described in the Background. The polymorphic automatic test system 10 does not use the crosspoint matrix due to accuracy limitations, but uses preferably a tester-per-pin architecture. The tester-per-pin architecture has V/I sources and meters on every available DUT pin. These tester-per-pin resources are accessed and programmed independently. Using the present polymorphic architecture, an M601 virtual composite instrument 26 is created using tester-per-pin hardware resources. Either all 48 tester-per-pin resources can be allocated to emulate all functions of the M601 virtual instrument or a subset of the tester per pin hardware can be allocated using only those resources that are actually required.

For example, the present tester system can emulate the physical Teradyne A360 tester job program, in order to connect 10 V to DUT pin 1, 0 volts to DUT pin 2 and the Voltmeter to DUT pin 3. (The actual prior art setup using the crosspoint matrix is described in the Background above.) The present test system simply connects the tester-per-pin resources directly to the DUT pins and utilizing directly the resources. The virtual composite instrument is created out of tester per pin resources connected to DUT pins 1, 2 and 3. The Virtual Graphical user debug window shows seven V/I sources, one meter and a crosspoint matrix having 9 lines×48 pins even though such physical instrument is not present within the test system 10. The programming and debugging of the job program is done without regard to the underlying hardware architecture. The interactive debug window allows interaction based on the seven V/I sources, one meter and the crosspoint matrix. Toggling a crosspoint, for example, actually reprograms and connects the appropriate V/I source or meter, but the user actually sees a crosspoint matrix closure on his debug window.

According to another illustrative example, the Teradyne A360 analog test system includes the M625 instrument, briefly described in the Background. The present test system 10 preferably uses several arbitrary waveform generators (AWG) for AC waveform generation. AC signal measurement is done with a set of Notch filters and a digitizer. The AWG's are used because they have far more capability and are more flexible in waveform generation. Digitizers are used since they deal better with complex AC waveforms. The test system generally has many AWG's and digitizers available to connect to the DUT pins. Using the polymorphic architecture, the M625 virtual composite instrument (26) is created using the AWG's and the digitizers and notch filters.

In this example, the present test system uses a tester-per-pin architecture using the AWG as the source for a 100 Hz signal to the DUT, and a single notch filter connected to the output of the DUT to eliminate the primary frequency. The filtered signal is then connected directly to a digitizer. The digitizer sample is taken on the resultant signal, which contains a complex waveform. This waveform is then analyzed using Fast Fourier Transform (FFT) techniques. All of the harmonic component content are derived from the FFT result.

In the ATE system based on the present polymorphic architecture, the M625 "virtual composite instrument" (26) is created using 2 AWG resources and a Notch filter resource and a digitizer. The virtual graphical user debug window shows two waveform generators, a notch filter, and a series of bandpass filters even though these physical instruments do not reside within the tester. The programming and debugging of the job program is done without regard to the underlying hardware architecture. The interactive debug window allows interaction based on the two waveform generators, notch filter, and series of bandpass filters. The change of a bandpass filter, for example, simply changes the frequency of interest result from the FFT analysis.

According to yet another illustrative example, the Teradyne A360 analog test system includes the M602 instrument, also briefly described in the Background. The present test system 10 the tester-per-pin voltage sources are sufficient in stability to provide the source, but the meters on these pins may not be of high enough accuracy to satisfy the test requirement. However, a precision calibration meter (primarily used for test calibration) includes a voltmeter of sufficient precision to satisfy the test requirements. The polymorphic test system 10 uses the above described architecture for creating an M602 'virtual composite instrument' (26) using tester-per-pin voltage resources for sources and the system calibration meter for measurement.

Specifically, in the ATE system based on polymorphic architecture, the virtual composite instrument (26) is created out of one or more of the tester-per-pin voltage resources and the system calibration meter. The virtual graphical user debug window shows two high stability voltage sources and a single high accuracy voltmeter even though that physical instrument is not present within the tester. The programming and debugging of the job program is done without regard to the underlying hardware architecture. The interactive debug window allows interaction based on the two high stability sources and the single high accuracy voltmeter.

A user operates the polymorphic test system by executing the following process: The user opens text editor of his choice and creates tester job program source in a selected prior art test system language. The user's output is saved to hard disk or some other data storage media connectable to the system.

The user opens a program development environment that is either Microsoft Visual Studio.NET® or Microsoft Visual Basic.NET®. The Program Development Environment has been configured to reference multiple Virtual Composite Language Add-In Components (46) and Virtual Composite Instrument Debug Components (44). The Program Development Environment is configured to reference a Tester Job Program Creation wizard. The Tester Job Program Creation wizard is a set of algorithms that automate a typically manual procedure of filtering and saving the tester job program and loading it into the development environment.

The user starts the Tester Job Program Creation wizard and then selects tester job language input filter from the list presented by the Tester Job Program Creation wizard. Then, the user selects the tester job program source (52) for input to the selected tester job language input filter (54). The Tester Job Program Creation wizard processes the tester job program through the selected tester job language filter.

The filter translates the job into VB.NET syntax. In this process, the user tester job program is passed through the filter one line at a time. The filter translates all standard program lines into syntactically correct VB.NET language statements. Furthermore, the filter maintains a list of all unresolved tags or references. The filter translates all Instrument Program related steps into syntactically correct Virtual Composite Instrument steps. Then the filter continues until end of tester job program source. The filter makes a second pass through the program to resolve all tags and references.

The test job language filter outputs a syntactically correct VB.NET source program. The Tester Job Program Generation wizard saves the output VB.NET source program to hard disk or some other connected data storage media. The Tester Job Program Generation wizard loads the output VB.NET source program into the program development environment. The user builds (compiles) the program to either an executable test program by pressing the build button on the Program Development Environment. (If the build is not successful, the user corrects the program and rebuilds until successful.) The user saves the output executable program to hard disk or other data storage media.

The user can then choose to run the program from the Program Development Environment or from the Production Mode User Interface. To run from the Program Development Environment, the user presses the run button provided in the Program Development Environment. Alternatively, to run from the Production Mode User Interface, the user starts the Production Mode User Interface Program. The user can load the executable program by selecting the "load job program" action from the menu bar of the Production Mode User Interface. The executable program is assigned a test site either automatically or by user selection. The Production Mode User Interface loads the selected program from hard disk.

The program runs line-by-line executing each statement in order. When a statement is reached that refers to a Virtual Composite Instrument execution occurs as follows: A call is made to the Dynamic Resource Allocation Module to determine if this 'virtual composite instrument' is already allocated. The dynamic resource allocation module checks the list of instantiated virtual composite instrument components (26A, 26B . . . 26N).

A. If the virtual composite instrument component has already been instantiated, the dynamic resource allocator gets the interface of the instantiated component. The Dynamic resource allocator returns the interface specification to the calling function and exits.

B. If no virtual composite instrument component has been instantiated, the dynamic resource allocator looks to the pool of un-instantiated Virtual Instrument Components to check if an instrument of the type requested has been defined as a Virtual Composite Instrument Component (26). If no, then it returns an error called "incomplete response" telling that caller that it doesn't understand what the requested instrument is. If yes, the Dynamic Resource Allocator looks to its list of virtual-to-physical resource connection data to determine all potential resources that could be allocated. The Allocator then checks the list of Reserved Physical Resources to eliminate all reserved physical resources from the potential resources determined. If any potential resources remain, the Dynamic Resource Allocator allocates the resources. Then, the Dynamic Resource Allocator instantiates a Virtual Instrument Component of the type requested.

After the Dynamic Resource Allocator instantiates the requested Virtual Instrument Component, the Allocator then adds this component to its list of reserved physical resources. The Dynamic Resource Allocator then returns the interface specification to the caller, as done in step A.

Figure 3B:
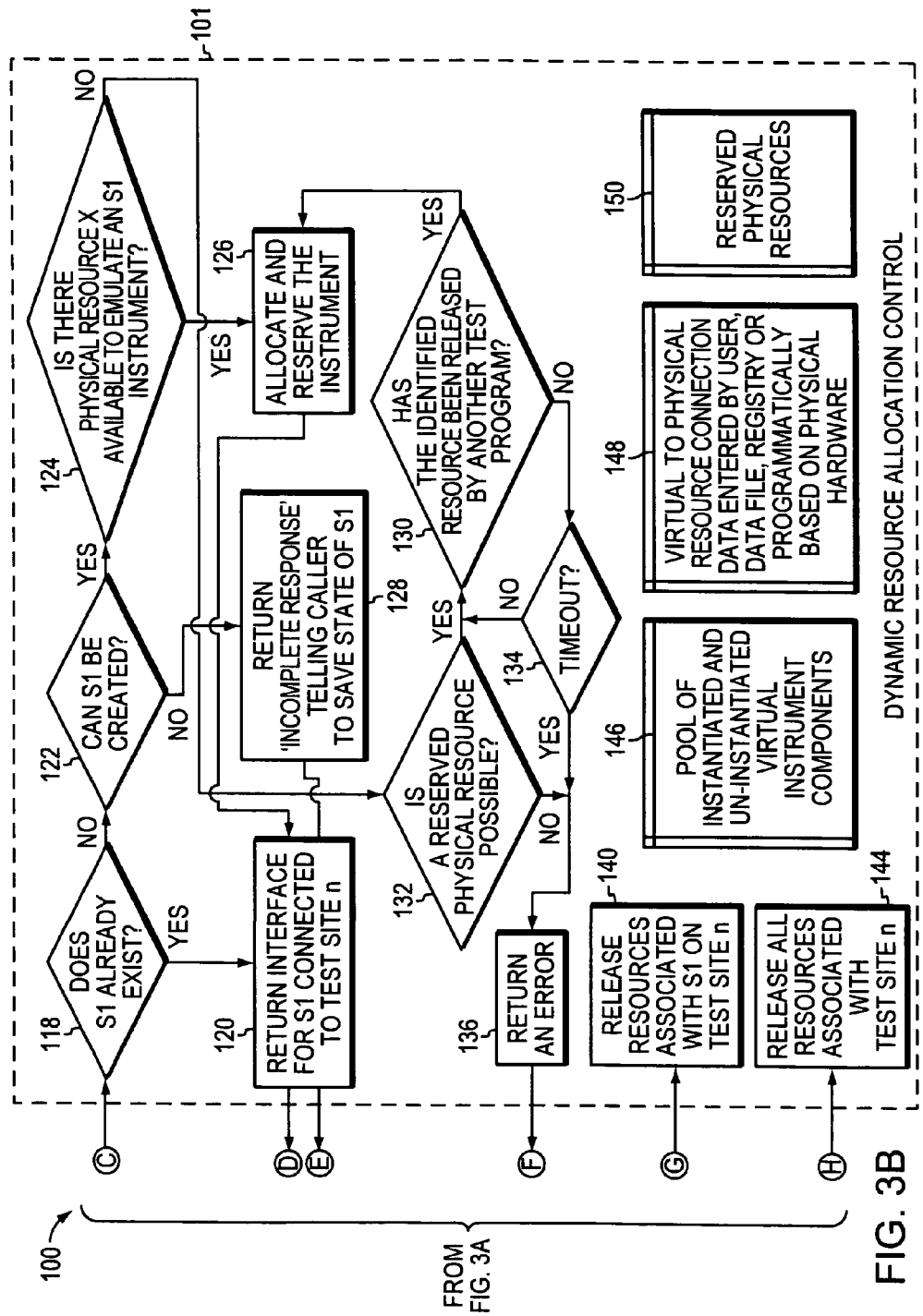

If no potential resources remain, the Dynamic Resource Allocator checks the list of Reserved Physical Resources to see if one is possible (see step 132 in FIG. 3B). If no Physical Resource is possible, then an error is returned to the caller (step 136). If yes, the Dynamic Resource Allocator enters a loop (steps 130 and 134) checking if the potential reserved Physical Resources has been unreleased by another running test program. If timeout occurs (step 134) before release an error is returned to the caller (step 136). If the resource is released prior to the timeout, then the Dynamic Resource Allocator allocates the resource (step 126), as shown in FIG. 3B.

The Dynamic Resource Allocator instantiates a Virtual Instrument Component (26) of the type requested. The Dynamic Resource Allocator then adds this component to its list of reserved physical resources. The Dynamic Resource Allocator then returns the interface specification to the calling function and exits.

The polymorphic test system 10 executes the testing sequences using the particular resources as defined in the tester job program. When a specific Virtual Composite Instrument is no longer needed after performing the test, it is released, as described above.

When a statement releasing a Virtual Composite Instrument is executed, the Dynamic Resource Allocator releases all resources attached to this Virtual Composite Instrument by removing them from the reserved physical resource list. Then, the Dynamic Resource Allocator un-instantiates the Virtual Composite Instrument.

Program continues all statements in the defined order until an 'end' statement is seen. When the end statement in the program is reached, the Dynamic Resource Allocator releases all resources attached to all Virtual Composite Instruments allocated to this site by removing them from the reserved physical resource list. As shown above, there may be several sites (34A . . . 34N). The Dynamic Resource Allocator un-instantiates all of the Virtual Composite Instruments allocated to the site. When the Dynamic Resource Allocator un-instantiates all of the Virtual Composite Instruments allocated to all sites, the program ends execution.

The polymorphic test system 10 can be used for many testing purposes. In the semiconductor manufacturing industry, the test system is used to test various types of semiconductor chips including chips under production. These are used, for example, as amplifiers, voltage regulators, power management devices, consumer devices, TV devices, memories, imaging chips, automotive chips, clock generation chips, analog-to-digital converters, digital-to-analog converters, rectifiers, resistors, or diodes. The test system is also used to test flat panel displays, and other devices that may not use Si or GaAs wafers. In the hybrid manufacturing industry, the test system is used to test hybrid microelectronic circuits; e.g., circuits used to combine many semiconductor chips on a ceramic or porcelain substrate for use in areas where heat or temperature is a significant factor such as in the engine compartment of an automobile, or in orbiting satellites. In the PC board industry, the test system is used to test complete printed circuit boards, including boards loaded with many semiconductor chips or other electronic elements. The test system is also used to test various mechanical or electromechanical devices (including devices fabricated by micro-machining or other process) and test biochips.

Having described various embodiments, implementations, and example of the present invention, it should be apparent to those skilled in the relevant art that the foregoing is illustrative only and not limiting. There are other embodiments or elements suitable for the above-described embodiments, described in the above-listed publications, all of which are incorporated by reference as if fully reproduced herein. Additional embodiments include combinations of elements described above in connection with the provided embodiment. The functions of any one element may be carried out in various ways in alternative embodiments. Also, the functions of several elements may, in alternative embodiments, be carried out by fewer, or a single, element.

The invention claimed is:

1. A composite instrument component for use in an automatic test instrument, comprising:
    at least two resource instrument components being associated with at least two test elements;
    a composite instrument template for combining at least two said resource instrument components to form an interactive object, and
    a test program component including information for sequencing said at least two test elements for testing an analog/mixed signal semiconductor device under test.

2. The composite instrument component of claim 1, wherein at least one of said test elements is a hardware test element.

3. The composite instrument component of claim 1, wherein at least one of said test elements includes a combined hardware-software test element.

4. The composite instrument component of claim 3, wherein said combined hardware-software test element includes an analog-to-digital converter (ADC) and an analyzer using a Fast Fourier Transform (FFT) technique.

5. The composite instrument component of claim 1, wherein said interactive object includes definitions provided in a Teradyne test system.

6. The composite instrument component of claim 5, wherein said resource instrument components are controlled by a Teradyne test system language.

7. The composite instrument component of claim 1, wherein said interactive object includes definitions provided in an LTX test system.

8. The composite instrument component of claim 7, wherein said resource instrument components are controlled by an LTX test system language.

9. The composite instrument component of claim 1, wherein said interactive object includes definitions provided in a Credence test system.

10. The composite instrument component of claim 9, wherein said resource instrument components are controlled by a Credence test system language.

11. The composite instrument component of claim 1, wherein said interactive object includes definitions provided in a specifically designed test system.

12. The composite instrument component of claim 11, wherein said resource instrument components are controlled by a language of said specifically designed test system.

13. The composite instrument component of claim 1 wherein said test elements are hardware sub-components.

14. The composite instrument component of claim 1 wherein said test elements are hardware components.

15. The composite instrument component of claim 14, wherein at least one of said hardware components is a high-level discrete instrument.

16. The composite instrument component of claim 15, wherein said high-level discrete instrument is a digital multimeter.

17. The composite instrument component of claim 15, wherein said high-level discrete instrument is a voltage source.

18. The composite instrument component of claim 15, wherein said high-level discrete instrument is a frequency generator.

19. A dynamic resource allocation component for use in an automatic test instrument for testing a semiconductor device, comprising:
    a list of resource instrument components including their availability status, and
    a map of virtual composite physical resource addresses, configured for dynamic allocation of components for running multiple devices under test (DUT).

20. The dynamic resource allocation component of claim 19 wherein each of said resource instrument components is associated with at least two test elements.

21. The dynamic resource allocation component of claim 20, wherein at least one of the test elements is a hardware test element.

22. The dynamic resource allocation component of claim 20, wherein at least one of the test elements includes a combined hardware-software test element.

23. A server executable for use in an automatic test instrument, comprising:
    at least two resource instrument components;
    a virtual composite instrument component corresponding to a hardware resource;
    a dynamic resource allocation component; and
    a site component interacting with said dynamic resource allocation component allocating virtual composite instrument and available said resources.

24. The server executable of claim 23, wherein said virtual composite instrument component includes:
    at least two resource instrument components being associated with at least two test elements; and
    a composite instrument template for combining at least two said resource instrument components to form an interactive object.

25. The server executable of claim 24, wherein said dynamic resource allocation component includes:
- a list of resource instrument components including their availability status; and
- a map of virtual composite physical resource addresses.

26. A server executable for use in an automatic test instrument, comprising:
- at least two virtual composite instrument components corresponding to at least two hardware resources associated with a hardware layer;
- a dynamic resource allocation component for allocating dynamically said virtual composite instrument components for running multiple devices under test (DUT); and
- a site component interacting with said dynamic resource allocation component assembling virtual composite instrument components from available said resources.

27. The server executable of claim 26, wherein said virtual composite instrument component includes:
- at least two resource instrument components being associated with at least two test elements; and
- a composite instrument template for combining at least two said resource instrument components to form an interactive object.

28. The server executable of claim 27, wherein said dynamic resource allocation component includes:
- a list of resource instrument components including their availability status; and
- a map of virtual composite physical resource addresses.

29. The server executable of claim 27, wherein at least one of said test elements is a hardware test element.

30. The server executable of claim 27, wherein at least one of said test elements includes a combined hardware-software test element.

* * * * *